(12) United States Patent
Chang et al.

(10) Patent No.: US 11,145,562 B2
(45) Date of Patent: Oct. 12, 2021

(54) PACKAGE STRUCTURE AND METHOD OF MANUFACTURING THE SAME

(71) Applicant: Taiwan Semiconductor Manufacturing Co., Ltd., Hsinchu (TW)

(72) Inventors: Jung-Hua Chang, Hsinchu (TW); Chih-Wei Wu, Yilan County (TW); Szu-Wei Lu, Hsinchu (TW); Ying-Ching Shih, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/721,829

(22) Filed: Dec. 19, 2019

(65) Prior Publication Data

US 2021/0193542 A1    Jun. 24, 2021

(51) Int. Cl.
*H01L 23/31* (2006.01)
*H01L 23/498* (2006.01)
*H01L 21/48* (2006.01)
*H01L 21/56* (2006.01)

(52) U.S. Cl.
CPC ...... *H01L 23/3128* (2013.01); *H01L 21/4853* (2013.01); *H01L 21/4857* (2013.01); *H01L 21/568* (2013.01); *H01L 23/49822* (2013.01); *H01L 23/49827* (2013.01)

(58) Field of Classification Search
CPC ............ H01L 21/563; H01L 23/49827; H01L 23/3128; H01L 2225/1058; H01L 2225/1041; H01L 24/17; H01L 24/97; H01L 21/4853; H01L 2924/15311; H01L 2924/181; H01L 2225/0652; H01L 23/49822; H01L 21/4857; H01L 2224/81; H01L 23/3218; H01L 21/568
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 10,914,895 B2 * | 2/2021 | Liao ........ G02B 6/122 |

* cited by examiner

*Primary Examiner* — Jasmine J Clark
(74) *Attorney, Agent, or Firm* — JCIPRNET (57) ABSTRACT

A package structure includes an interposer, a die and a conductive terminal. The interposer includes an encapsulant substrate, a through via and an interconnection structure. The through via is embedded in the encapsulant substrate. The interconnection structure is disposed on a first side of the encapsulant substrate and electrically connected to the through via. The die is electrically bonded to the interposer and disposed over the interconnection structure and the first side of the encapsulant substrate. The conductive terminal is disposed on a second side of the encapsulant substrate vertically opposite to the first side, and electrically connected to the interposer and the die.

20 Claims, 10 Drawing Sheets

PACKAGE STRUCTURE AND METHOD OF MANUFACTURING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

Currently, Chip-On-Wafer-On-Substrate (CoWoS) packaging technology facilitating power-efficient and high-speed computing has been developed. However, there still are quite a few challenges to be handled for the technology of CoWoS package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1, FIG. 2A to FIG. 7A, FIG. 8 and FIG. 9 are schematic cross-sectional views illustrating a method of manufacturing a package structure according to some embodiments of the disclosure.

FIG. 2B to FIG. 7B respectively illustrate enlarged schematic cross-sectional view of the dashed area C of FIG. 2A to FIG. 7A according to some embodiments of the disclosure.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1, FIG. 2A to FIG. 7A, FIG. 8 and FIG. 9 are schematic cross-sectional views illustrating a method of manufacturing a package structure according to some embodiments of the disclosure. FIG. 2B to FIG. 7B are enlarged schematic cross-sectional views corresponding to the dashed areas C of FIG. 2A to FIG. 7A according to some embodiments of the disclosure. FIG. 10 is a schematic cross-sectional view illustrating a package structure according to some embodiments of the disclosure.

Figure 1:
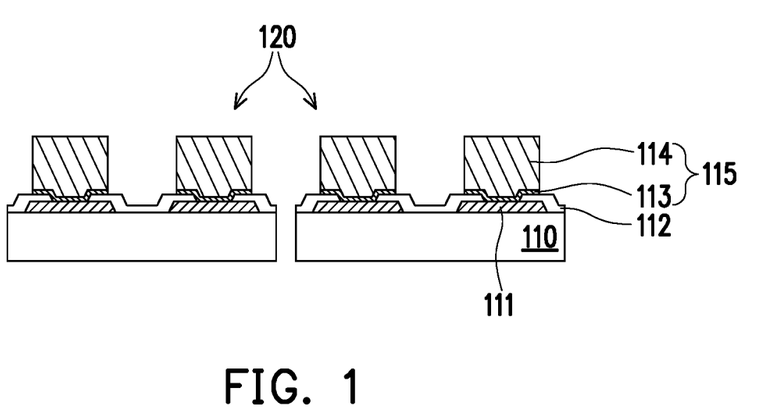

Referring to FIG. 1, a plurality of dies 120 are provided. In some embodiments, the dies 120 are cut from a same wafer or different wafers. The dies 120 may be the same types of dies or the different types of dies. For example, the dies 120 may respectively be an application-specific integrated circuit (ASIC) chip, a system on chip (SoC), an analog chip, a sensor chip, a wireless and radio frequency chip, a voltage regulator chip, a memory chip or the like. The number of the die 120 shown in the figures is merely for illustration, and the disclosure is not limited thereto.

In some embodiments, the dies 120 may have similar structures. For example, the die 120 includes a substrate 110, a plurality of pads 111, a passivation layer 112, and a plurality of connectors 115. In some embodiments, the substrate 110 is a semiconductor substrate made of silicon and/or other semiconductor materials. Alternatively or additionally, the substrate 110 includes other elementary semiconductor materials such as germanium, gallium arsenic, or other suitable semiconductor materials. In some embodiments, the substrate 110 may further include other features such as various doped regions, a buried layer, and/or an epitaxy layer. Moreover, in some embodiments, the substrate 110 is made of an alloy semiconductor such as silicon germanium, silicon germanium carbide, gallium arsenic phosphide, or gallium indium phosphide. Furthermore, the substrate 110 may be a semiconductor on insulator such as silicon on insulator (SOI) or silicon on sapphire.

In some embodiments, the substrate 110 has a plurality of devices formed therein and/or thereon. In some embodiments, the devices may be active devices, passive devices, or a combination thereof. In some embodiments, the devices are integrated circuit devices. The devices are, for example, transistors, capacitors, resistors, diodes, photodiodes, fuse devices, or the like, or combinations thereof.

In some embodiments, an interconnection structure (not shown) is formed over the devices of the substrate 110. The interconnection structure includes a metallization structure formed in a dielectric structure. The metallization structure electrically connects the different devices in and/or on the substrate 110, so as to form a functional circuit. In some embodiments, the dielectric structure includes an inter-layer dielectric layer (ILD) and one or more inter-metal dielectric layers (IMD). In some embodiments, the metallization structure includes multiple layers of metal lines and plugs (not shown). The metal lines and plugs include conductive materials, such as metal, metal alloy or a combination thereof. For example, the conductive material may include tungsten (W), copper (Cu), copper alloys, aluminum (Al), aluminum alloys, or combinations thereof. The plugs include contact plugs and via plugs. The contact plugs are located in the ILD to be connected to the metal lines and the devices. The via plugs are located in the IMD to be connected to the metal lines in different layers.

The pads 111 may be or electrically connected to a top conductive feature of the interconnection structure, and further electrically connected to the devices formed on the substrate 110 through the interconnection structure. The material of the pads 111 may include metal or metal alloy, such as aluminum, copper, nickel, or alloys thereof.

The passivation layer 112 is formed over the substrate 110 and covers a portion of the pads 111. The material of the passivation layer 112 may include silicon oxide, silicon nitride, silicon oxynitride, or a combination thereof. Additionally or alternatively, the passivation layer 112 may include a polymer material such as photosensitive polybenzoxazole (PBO), polyimide (PI), benzocyclobutene (BCB), a combination thereof, and/or the like. Portions of the pads 111 are exposed by the passivation layer 112 for further electrical connection. The connectors 115 are formed on and electrically connected to the pads 111 exposed by the passivation layer 112. The connector 115 includes solder bumps, gold bumps, copper bumps, copper posts, copper pillars, or the like. In some embodiments, the connector 115 includes a seed layer 113 and a conductive pillar 114 on the seed layer 113. The seed layer 113 may be a metal seed layer such as a copper seed layer. In some embodiments, the seed layer 113 includes a first metal layer such as a titanium layer and a second metal layer such as a copper layer over the first metal layer. The conductive pillar 114 may include copper, nickel and/or other suitable metals. In some embodiments, a structure of the conductive pillar 114 includes copper, copper/nickel, or copper/nickel/copper. In other words, the conductive pillar 114 may include a copper post, and a nickel layer may be disposed on the top of the copper post, or embedded in the copper post at a position near the top surface of the copper post.

Figure 2A:
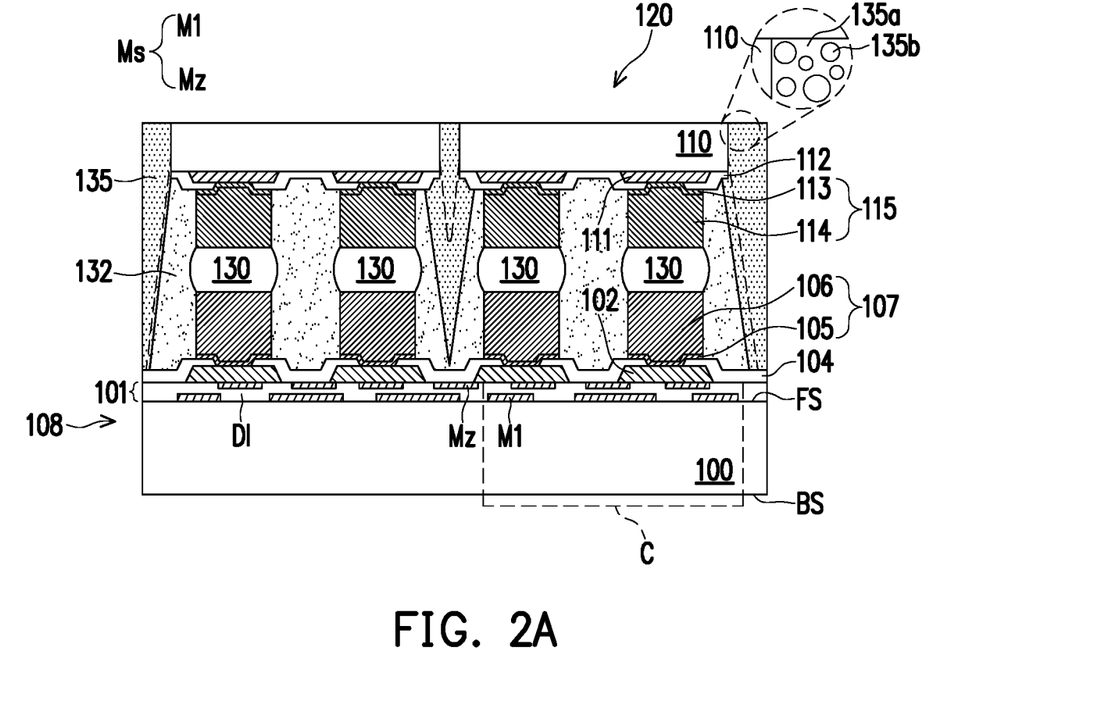

Referring to FIG. 2A, the dies 120 are mounted on a wafer 108. In some embodiments, the dies 120 are electrically bonded to the wafer 108 through a plurality of connectors 130. The mounting of the dies 120 to the wafer 108 may include pick-and-place processes. In is noted that, the number of the dies 120 mounted on the wafer 108 is merely for illustration, and the disclosure is not limited thereto. In some embodiments, the wafer 108 includes a plurality of packaging regions, and each of the packaging regions include one or more dies 120 mounted thereon. The wafer 108 is a semiconductor wafer, and may also be referred to as a wafer interposer or an initial interposer.

In some embodiments, the wafer 108 includes a substrate 100, an interconnection structure 101, a plurality of pads 102, a passivation layer 104, and a plurality of connectors 107. In some embodiments, the substrate 100 is a semiconductor substrate, and the material of the substrate 100 is similar to, and may be the same as or different from those of the substrate 110 of the die 120. For example, the substrate 100 is a silicon substrate. In some embodiments, the substrate 100 is a blank silicon substrate, and is free of devices formed therein and/or thereon. The substrate 100 has a front side FS and a backside BS opposite to each other.

The interconnection structure 101 is disposed on the front side FS of the substrate 100. In some embodiments, the interconnection structure 101 includes a metallization structure Ms and a dielectric structure DI. The metallization structure Ms includes multiple conductive features interconnected to each other and embedded in the dielectric structure DI. The conductive features may include multi-layers of conductive lines and conductive vias stacked alternately; the conductive vias may be disposed vertically between the conductive lines so as to electrically connect the conductive lines in different layers.

Bottom (i.e. bottommost) conductive features M1 and top (i.e. topmost) conductive features Mz of the metallization structure Ms are shown in FIG. 1B for illustration. It is understood that multiple layers of conductive features are disposed between the bottom conductive features M1 and the top conductive features Mz. The conductive features may include metal, metal alloy or a combination thereof. For example, the conductive material may include tungsten (W), copper (Cu), copper alloys, aluminum (Al), aluminum alloys, or combinations thereof. The dielectric structure DI may include a plurality of dielectric layers. In some embodiments, the dielectric structure DI is an inorganic dielectric structure. Additionally or alternatively, the dielectric structure DI may include organic dielectric material. For example, the material of the dielectric structure DI may include silicon oxide, silicon nitride, silicon oxynitride, silicon carbide, low-K dielectric material, such as un-doped silicate glass (USG), phosphosilicate glass (PSG), boron-doped phosphosilicate glass (BPSG), fluorinated silica glass (FSG), SiOxCy, Spin-On-Glass, Spin-On-Polymers, silicon carbon material, compounds thereof, composites thereof, combinations thereof, or the like.

Figure 2B:
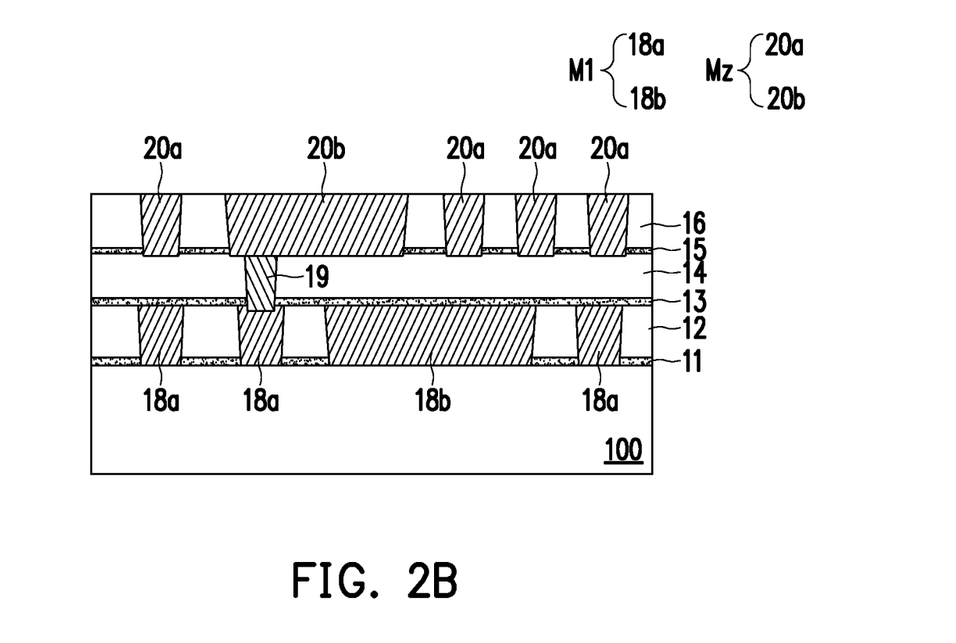

FIG. 2B illustrates an enlarged cross-sectional view of portions of the interconnection structure 101 and substrate 100 in the dashed region C of FIG. 2A.

Referring to FIG. 2A and FIG. 2B, in some embodiments, the dielectric structure DI includes a plurality of dielectric layers 11-16. In some embodiments, the dielectric layers includes a plurality of interlayer dielectric layers, and etch stop layer may be optionally formed between the interlayer dielectric layers. For example, the dielectric layers 12, 14, 16 are interlayer dielectric layers (ILDs), and the dielectric layers 11, 13, 15 are etch stop layers. The etch stop layers include different material than the interlayer dielectric layers. For example, the interlayer dielectric layers include silicon oxide, while the etch stop layers include silicon nitride. The dielectric layers may be formed by a deposition process, such as chemical vapor deposition (CVD) process, a plasma enhanced CVD (PECVD) process, or the like.

In some embodiments, the metallization structure Ms includes conductive lines 18a/18b, conductive via(s) 19, and conductive lines 20a/20b connected to each other. The conductive lines 18a/18b are embedded in and penetrate through the dielectric layers 12 and 11. One or more conductive via 19 penetrates through the dielectric layers 13 and 14 to electrically connect to the conductive lines 18a/18b. In some embodiments, a portion of the conductive via 19 may extend into the conductive line 18a/18b, but the disclosure is not limited thereto. The conductive lines 20*a*/20*b* penetrate through the dielectric layers 16 and 15 to electrically connect to the conductive via 19. In some embodiments, the conductive lines 20*a*/20*b* may further extend into the dielectric layer 14, but the disclosure is not limited thereto. The forming method of the conductive lines and the conductive vias may include single damascene process and/or dual damascene process. It is noted that, the number of the layers of the dielectric layers and the number of layers of the conductive lines and conductive vias shown in FIG. 2B are merely for illustration, and the disclosure is not limited thereto.

In some embodiments, the conductive lines 18*a* and 18*b* are the bottom conductive feature M1 of the metallization structure Ms, and the dielectric layer 11 is the bottom dielectric layer of the dielectric structure DI. In some embodiments, the bottom surfaces of the metal lines 18*a* and 18*b* are substantially coplanar with the bottom surface of the etch stop layer 11 (i.e. the bottom surface of the dielectric structure DI). The bottom surfaces of the metal lines 18*a* and 18*b* and the etch stop layer 11 may be in physical contact with the front surface (e.g. top surface) of the substrate 100. In some embodiments, the conductive line 18*b* has a larger dimension (e.g. width) than the conductive line 18*a*. For example, the conductive line 18*b* may have a width in a range of about 10-50 um, such as 14 μm. The conductive line 18*b* may serve as a conductive line pad for further electrical connection in the subsequent processes.

In some embodiments, the conductive lines 20*a* and 20*b* are the top conductive feature Mz of the metallization structure, and the dielectric layer 16 is a top dielectric layer of the dielectric structure DI. The top surfaces of the conductive lines 20*a* and 20*b* may be substantially coplanar with the top surface of the dielectric layer 16 (i.e. the top surface of the dielectric structure DI).

Referring back to FIG. 2A, the pads 102 are disposed on the interconnection structure 101 and electrically connected to the top conductive feature Mz of the interconnection structure 101. The passivation layer 104 is formed on the interconnection structure 101 and covers portions of the pads 102. Other portions of the pads 102 are exposed by the passivation layer 104, and the connectors 107 are formed on and electrically connected to the pads 102 exposed by the passivation layer 104. The connector 107 may include a seed layer 105 and a conductive pillar 106 on the seed layer 105. The materials of the pads 102, the passivation layer 104, and the connector 107 are respectively similar to, and may be the same as or different from the pads 111, the passivation layer 112 and the connector 115 of the die 120 described above, which are not repeated again here.

Still referring to FIG. 2A, in some embodiments, the dies 120 are mounted to the interposer 108 through a plurality of conductive bump 130. The conductive bumps 130 may be solder bumps, silver balls, copper balls, or any other suitable metallic balls. In some embodiments, the conductive bumps 130 are micro bumps.

In some embodiments, the dies 120 are mounted to the wafer 108 in a flip-chip manner. For example, the dies 120 shown in FIG. 1A are flipped upside down, and the connectors 115 of the dies 120 are electrically bonded to the connectors 107 of the wafer 108 through the conductive bumps 130. The conductive bumps 130 are vertically between the connectors 115 and the connectors 107 to provide the electrical connection therebetween. In some embodiments, the conductive bump 130 may extend to cover a portion of the sidewall of the connector 107 and/or a portion of the sidewall of the connector 115.

In some embodiments, after the dies 120 are bonded to the wafer 108, underfill layers 132 may be formed to fill the spaces between the dies 120 and the wafer 108 by, for example, dispensing processes. The underfill layer 132 may include a polymer material, such as resin. The underfill layer 132 may further include a plurality of small fillers distributed in the polymer material or free of filler. The underfill layer 132 laterally surrounds the connectors 115 and 107 and the conductive bumps 130, partially covers the top surface of the passivation layer 104 of the wafer 108, and may partially or completely cover the bottom surfaces of the passivation layers 112 of the dies 120. In some embodiments, the underfill layer 132 completely covers the bottom surfaces of the passivation layers 112 and may further extend to cover sidewalls of the dies 120, as shown as the dotted line in FIG. 2A. The underfill layers 132 corresponding to adjacent dies 120 may be separate from each other or connected to each other.

Thereafter, an encapsulant 135 may be formed on the wafer 108 to laterally encapsulant the dies 120 and the underfill layers 132. In some embodiments, the encapsulant 135 includes a molding compound, a molding underfill, a resin such as epoxy, a combination thereof, or the like. In some other embodiments, the encapsulant 135 includes a photo-sensitive material such as polybenzoxazole (PBO), polyimide (PI), benzocyclobutene (BCB), a combination thereof, or the like. In alternative embodiments, the encapsulant 135 includes nitride such as silicon nitride, oxide such as silicon oxide, phosphosilicate glass (PSG), borosilicate glass (BSG), boron-doped phosphosilicate glass (BPSG), a combination thereof, or the like. In some embodiments, the encapsulant 135 includes a molding compound which is a composite material including a base material (such as polymer) 135*a* and a plurality of fillers 135*b* distributed in the base material 135*a*. The filler 135*b* may be a single element, a compound such as nitride, oxide, or a combination thereof. The fillers 135*b* may include silicon oxide, aluminum oxide, boron nitride, alumina, silica, or the like, for example. In some embodiments, the fillers 135*b* are spherical particles, or the like. The cross-section shape of the filler 135*b* may be circle, oval, or any other shape. In some embodiments, the fillers 135*b* include solid fillers, hollow fillers, or a combination thereof.

In some embodiments, the encapsulant 135 may be formed by an over-molding process and a planarization process. For example, an encapsulant material layer is formed on the wafer 108 to laterally encapsulate the underfill layers 132 and the dies 120, and cover the top surfaces of the dies 120. Thereafter, a planarization process such as a chemical mechanical polishing (CMP) is performed to remove the encapsulant material layer over the top surfaces of the dies 120, so as to form the encapsulant 135. In some embodiments, the tops surface of the encapsulant 135 is substantially coplanar with the top surfaces (i.e. back surface) of the dies 120. Herein, the back surface of the die or wafer refers to a surface opposite to the front surface of the die or wafer which is close to the pad. The back surface of the die or wafer may be a surface of a substrate, and the front surface has pad or connector.

In some embodiments, the structure shown in FIG. 2A is also referred to as a chip-on wafer (CoW) structure.

Figure 3A:
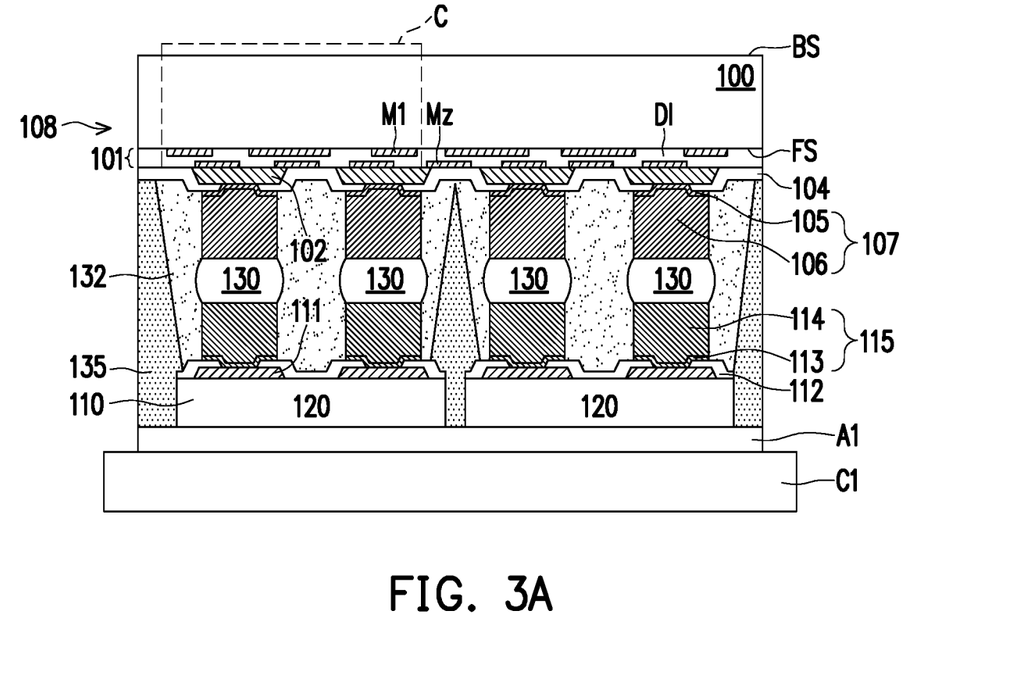

Referring to FIG. 3A, the CoW structure shown in FIG. 2A is flipped upside down, and mounted to a carrier C1. The carrier C1 may be a glass carrier, a ceramic carrier, or the like. In some embodiments, the carrier C1 has a de-bonding layer (not shown) formed thereon. The de-bonding layer may be formed of an adhesive such as an Ultra-Violet (UV)

glue, a Light-to-Heat Conversion (LTHC) glue, or the like, or other types of adhesives. The de-bonding layer may be decomposable under the heat of light to thereby release the carrier C1 from the overlying structures in subsequent steps. In some embodiment, the CoW structure is attached to the carrier C1 through an adhesive layer A1 such as a die attach film (DAF), silver paste, or the like.

For example, the adhesive layer A1 is applied to the back surfaces of the dies 120 and the surface of the encapsulant 135, and the dies 120 and the encapsulant 135 are attached to the carrier C1 through the adhesive layer A1.

Figure 3B:
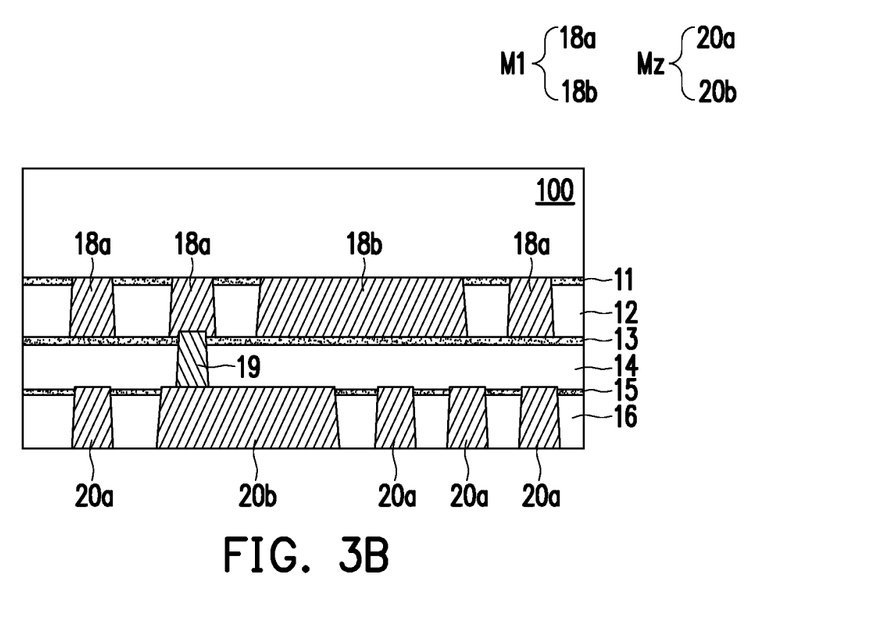
Figure 4A:
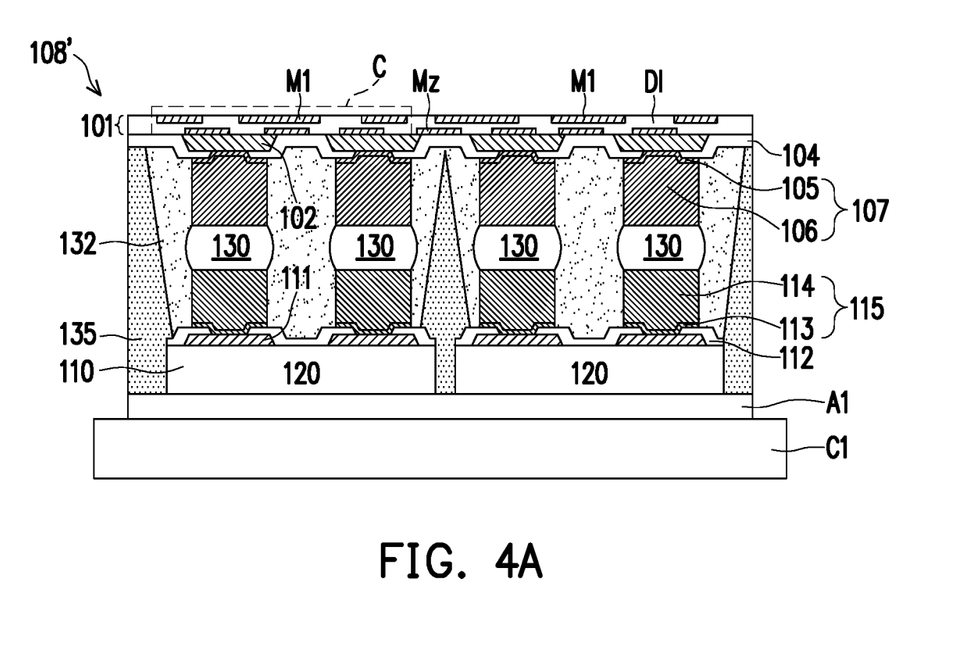
Figure 4B:
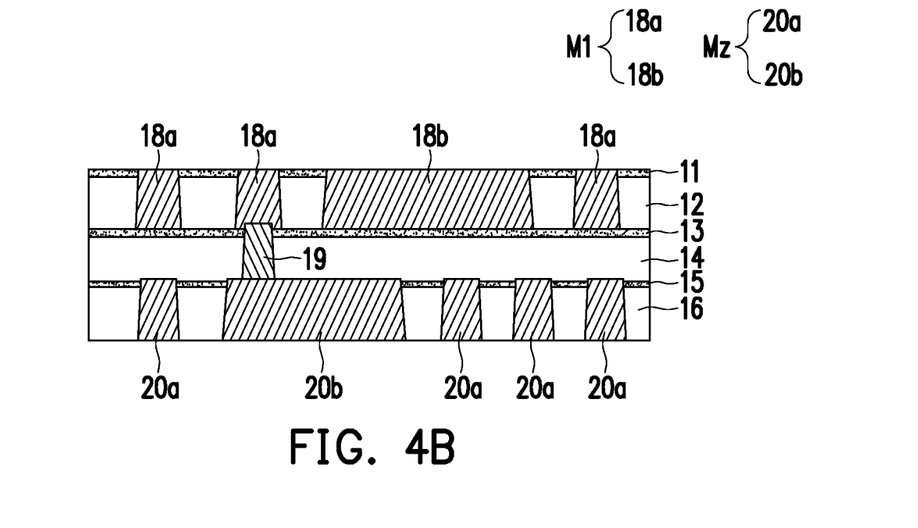

As shown in FIG. 3A and FIG. 3B, after mounting to the carrier C1, the backside BS of the wafer 108 faces up, and the back surface of the substrate 100 is exposed.

Referring to FIG. 3A and FIG. 3B to FIG. 4A and FIG. 4B, a removal process is performed to remove the substrate 100 from the backside of the wafer 108, so as to expose the top surface of the interconnection structure 101, and a wafer 108' is formed. The removal process may include an etching process, a planarization process such as grinding or CMP, or combinations thereof. In some embodiments, the substrate 100 is completely removed by the removal process, and the wafer 108' may be free of semiconductor material, such as silicon. After the removal process is performed, the top surfaces of the dielectric structure DI and the conductive feature M1 of the metallization structure (e.g. the top surfaces of the dielectric layer 11 and the conductive lines 18a and 18b) are exposed, and are substantially coplanar with each other.

Figure 5A:
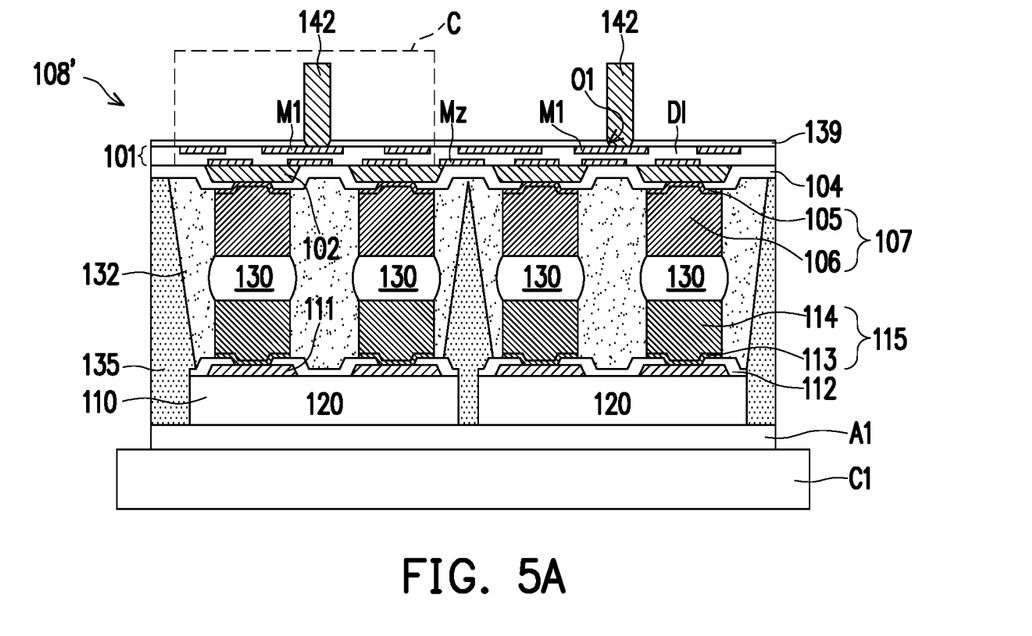
Figure 5B:
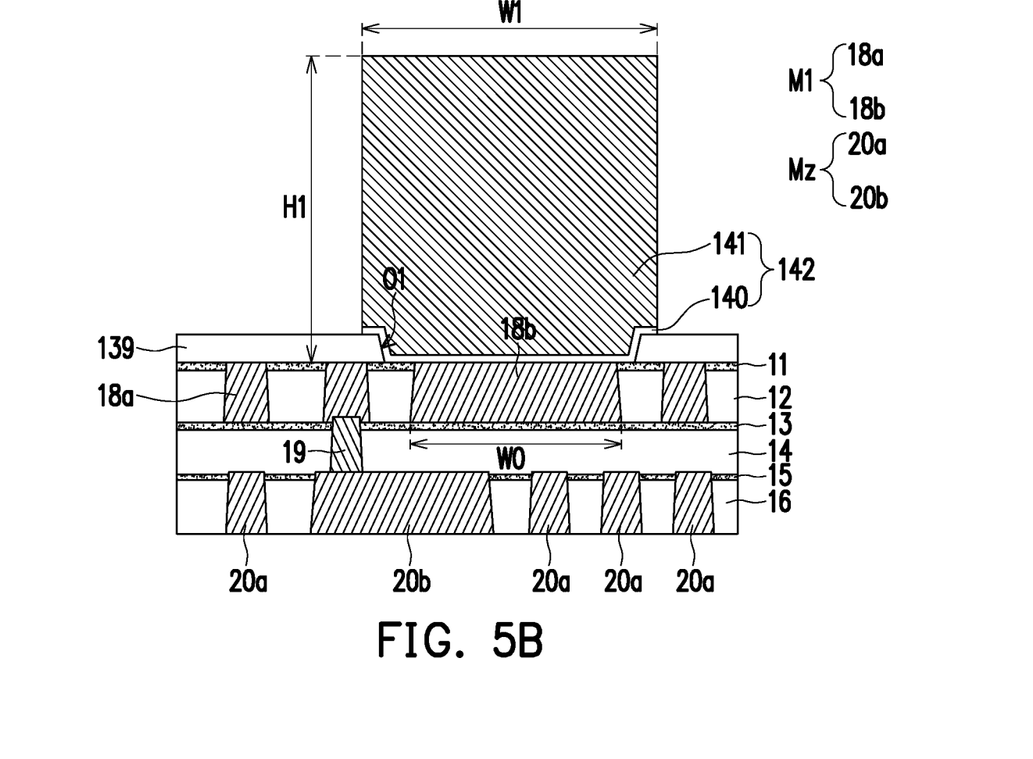

Referring to FIG. 5A and FIG. 5B, a plurality of conductive posts 142 are formed on and electrically connected to the interconnection structure 101. For example, the conductive posts 142 are landing on the conductive line pads 18b of the conductive feature M1. The conductive post 142 may include metal or metal alloy, such as copper, nickel, titanium, alloys thereof, or the like, or combinations thereof. In some embodiments, the conductive post 142 includes a seed layer 140 and a conductive pillar 141 formed on the seed layer 140. The seed layer 140 may be a metal seed layer such as a copper seed layer. In some embodiments, the seed layer 140 includes a first metal layer such as a titanium layer and a second metal layer such as a copper layer over the first metal layer. The conductive pillar 141 may include a metal, such as copper or other suitable metals.

In some embodiments, a dielectric layer 139 is optionally formed on the interconnection structure 101 before forming the conductive posts 140. The dielectric layer 139 may be a polymer layer. For example, the dielectric layer 139 may include polybenzoxazole (PBO), polyimide (PI) such as low temperature PI (LTPI), benzocyclobutene (BCB), a combination thereof or the like. Alternatively or additionally, the dielectric layer 139 may include an inorganic dielectric material such as silicon oxide, silicon nitride, silicon oxynitride, the like, or combinations thereof.

In some embodiments, the dielectric layer 139 and the conductive posts 142 may be formed by the following processes. After the removal process described above is performed, a dielectric material layer is formed on the interconnection structure 101 by chemical vapor deposition, spin coating, or other suitable method. The dielectric material layer covers the top surface of the interconnection structure 101. Thereafter, the dielectric material layer is patterned to form the dielectric layer 139 having openings O1. The patterning method of the dielectric material layer may include laser drilling process, lithograph and etching processes, or the like.

Referring to FIG. 5A and the FIG. 5B, the openings O1 penetrate through the dielectric layer 139 to at least expose a portion of the conductive feature M1 of the interconnection structure 101. In some embodiments, the opening O1 partially or completely exposes the top surface of the conductive line pad 18b of the conductive feature M1. In some embodiments, the opening O1 completely exposes the top surface of the conductive line pad 18b and may further expose a portion of the top surface of the dielectric layer 11 of the dielectric structure DI.

Thereafter, a seed material layer is formed on the dielectric layer 139 and the interconnection structure 101. The seed material layer covers the top surface of the dielectric layer 139 and fills in the openings O1 to be in physical and electrical contact with the conductive line pad 18b. A mask layer, such as a photoresist, is then formed on the seed material layer. The mark layer has openings at the locations where the conductive pillars 141 are to be formed. For example, the openings expose the seed material layer in the openings O1 and portions of the seed material layer on the dielectric layer 139. Thereafter, the conductive pillar 141 is formed on the seed material layer exposed by the openings of the mark layer by a plating (e.g. electroplating) process, for example. Afterwards, the mask layer may be removed by a stripping process, and the seed material layer previously covered by the mask layer is removed by an etching process using the conductive pillar 141 as an etching mask. As such, the conductive pillar 141 and the underlying seed layer 140 constitute the conductive post 142.

Still referring to FIG. 5A and FIG. 5B, in some embodiments, the bottom surface of the conductive post 142 is in contact with the top surface of the conductive feature M1 (e.g. conductive line pad 18b) and may further contact a portion of the top surface of the dielectric structure DI (e.g. the dielectric layer 11). The width W1 of the conductive post 142 may be larger than, equal to or less than the width W0 of the conductive line pad 18b. For example, the width W1 of the conductive post 142 ranges from 20 µm to 30 µm. In some embodiments, the height H1 of the conductive post 142 may be in a range of 70 µm to 120 µm, such as 80 µm or larger than 100 µm. The aspect ratio of the conductive post 142 may be in a range of 5 to 7, for example. The conductive posts 142 may optionally cover a portion of the top surface of the dielectric layer 139.

Figure 6A:
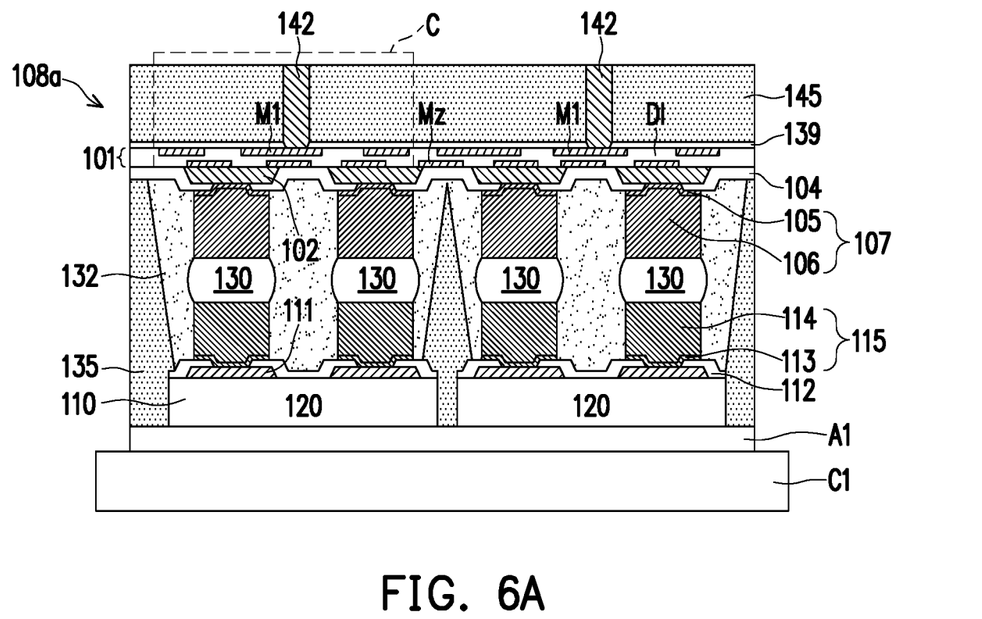
Figure 6B:
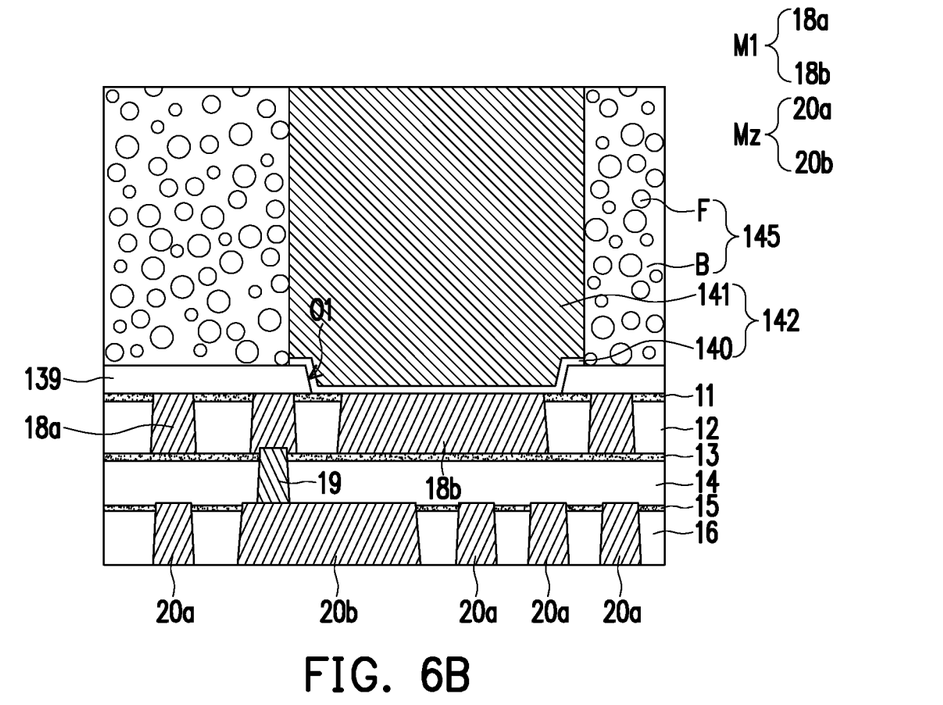

Referring to FIG. 6A and FIG. 6B, an encapsulant 145 is formed over the interconnection structure 101 to laterally encapsulate the conductive posts 142. The material of the encapsulant 145 may be selected from the same candidate material of the encapsulant 135, and the material of the encapsulant 145 may be the same as or different from the material of the encapsulant 135. For example, the encapsulant 145 is a molding compound which is a composite material including a base material B and a plurality of fillers F distributed in the base material B. In some embodiments, the base material B is free of semiconductor material. The base material B may include polymer material(s). For example, the base material B may include resins, such as epoxy resins. In some embodiments, the fillers include dielectric materials, and may be free of semiconductor material. The fillers F may include a single element, a compound such as nitride, oxide, or a combination thereof. The fillers F may include silicon oxide, aluminum oxide, boron nitride, alumina, silica, or the like, for example. In some embodiments, the fillers F are spherical particles, or the like. The cross-section shape of the filler F may be circle, oval, or any other shape. In some embodiments, the fillers F include solid fillers, hollow fillers, or a combination thereof.

It should be understood that the size, number, and distribution of the fillers F in the base material B shown in the figures are merely for illustration, and the disclosure is not limited thereto.

In some embodiments, the encapsulant 145 is formed by the following processes. After the conductive posts 142 are formed, an encapsulant material layer is formed on the dielectric layer 139 to encapsulate sidewalls and top surfaces of the conductive posts 142 by an over-molding process. Thereafter, a planarization process such as a CMP process is performed to remove the encapsulant material layer over the top surfaces of the conductive posts 142, so as to expose the conductive posts 142, and the encapsulant 145 laterally encapsulating the conductive posts 142 is formed.

Still referring to FIG. 6A and FIG. 6B, in some embodiments, the top surface of the encapsulant 145 is substantially coplanar with the top surfaces of the conductive posts 142. In other words, the conductive posts 142 penetrate through the encapsulant 145 to connect to the interconnection structure 101. The conductive post 142 may also be referred to as through via (TV), such as a through molding via (TMV) in the embodiments in which the encapsulant 145 includes a molding compound. In some embodiments in which the dielectric layer 139 is formed, the conductive posts 142 penetrate through the encapsulant 145 and the dielectric layer 139 to be in physical and electrical contact with the conductive feature M1 (e.g. conductive line pad 18b) of the interconnection structure 101.

In some embodiments, the encapsulant 145, the conductive posts 142, the dielectric layer 139, the interconnection structure 101, the pads 102, the passivation layer 104 and the connectors 107 together constitute a new interposer 108a. The interposer 108a may also be referred to as an encapsulant interposer, and the encapsulant 145 serves as a new substrate of the encapsulant interposer 108a. The encapsulant 145 may also be referred to as an encapsulant substrate of the encapsulant interposer 108a. In some embodiments, the semiconductor substrate 100 of the initial interposer (wafer) 108 has been removed completely (FIG. 4A), and the substrate (i.e. the encapsulant 145) of the interposer 108a is free of semiconductor material. In some embodiments, the conductive posts 142 are laterally encapsulated by and in physical contact with (e.g. the base material B and some fillers F of) the encapsulant 145, and there is free of dielectric liner between the conductive posts 142 and the encapsulant 145, which is different from the conductive posts embedded in the semiconductor substrate of a conventional interposer.

Figure 7A:
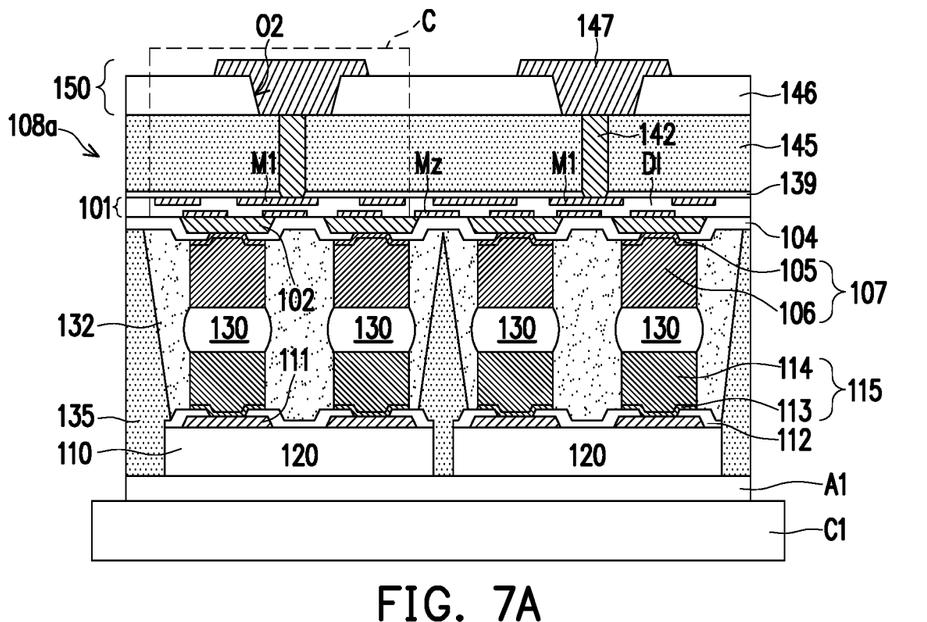
Figure 7B:
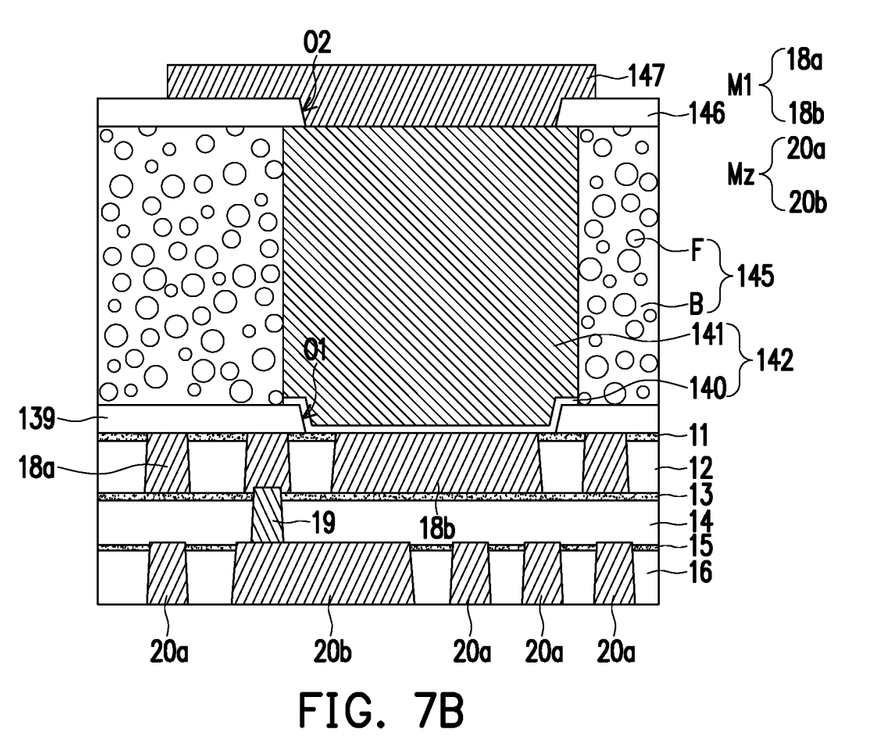

Referring to FIG. 7A and FIG. 7B, a redistribution layer (RDL) structure 150 is formed on and electrically connected to the interposer 108a. The RDL structure 150 may include one or more dielectric layer and one or more redistribution layer stacked alternately. For example, the RDL structure 150 may include a dielectric layer 146 and a redistribution layer 147. The dielectric layer 146 may be a polymer layer and may include PBO, PI such as LTPI, BCB, a combination thereof or the like. The redistribution layer 147 penetrates through the dielectric layer 146 to connect to the through vias 142 of the interposer 108a. The redistribution layer 147 includes conductive materials. The conductive materials may include metal such as copper, nickel, titanium, a combination thereof or the like. In some embodiments, the redistribution layer 147 includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer on the first metal layer. The metal layer may be copper or other suitable metals.

In some embodiments, the RDL structure 150 may be formed by the following processes. A dielectric material layer is formed on the top surfaces of the encapsulant 145 and the conductive posts 142 by deposition process or spin coating process. A patterning process (such as laser drilling process or photolithograph and etching processes) is performed on the dielectric material layer, so as to form the dielectric layer 146 having openings O2. The openings O2 may partially or completely expose the top surfaces of the conductive posts 142. In some embodiments, the openings O2 expose the top surfaces of the conductive posts 142 and further expose a portion of the top surface of the encapsulant 145. Thereafter, a seed material layer is formed on the dielectric layer 146 and filling into the openings O2 to be in contact with the conductive posts 142. A mask layer such as a photoresist is formed on a portion of the seed material layer. The mask layer has openings at the locations where the redistribution layer 147 is to be formed. A conductive layer is then formed on the seed material layer exposed by the mask layer. Thereafter, the mask layer is stripped, and the seed material layer previously covered by the mask layer is removed by an etching process with the conductive layer as an etching mask. As such, the conductive layer and the underlying seed layer constitute the redistribution layer 147.

It is noted that, the number of the layers of the dielectric layer 146 and the redistribution layer 147 included in the RDL structure 150 is merely for illustration, and the disclosure is not limited thereto. The number of layers of dielectric layers and redistribution layers may be adjusted according to product design and requirement.

Figure 8:
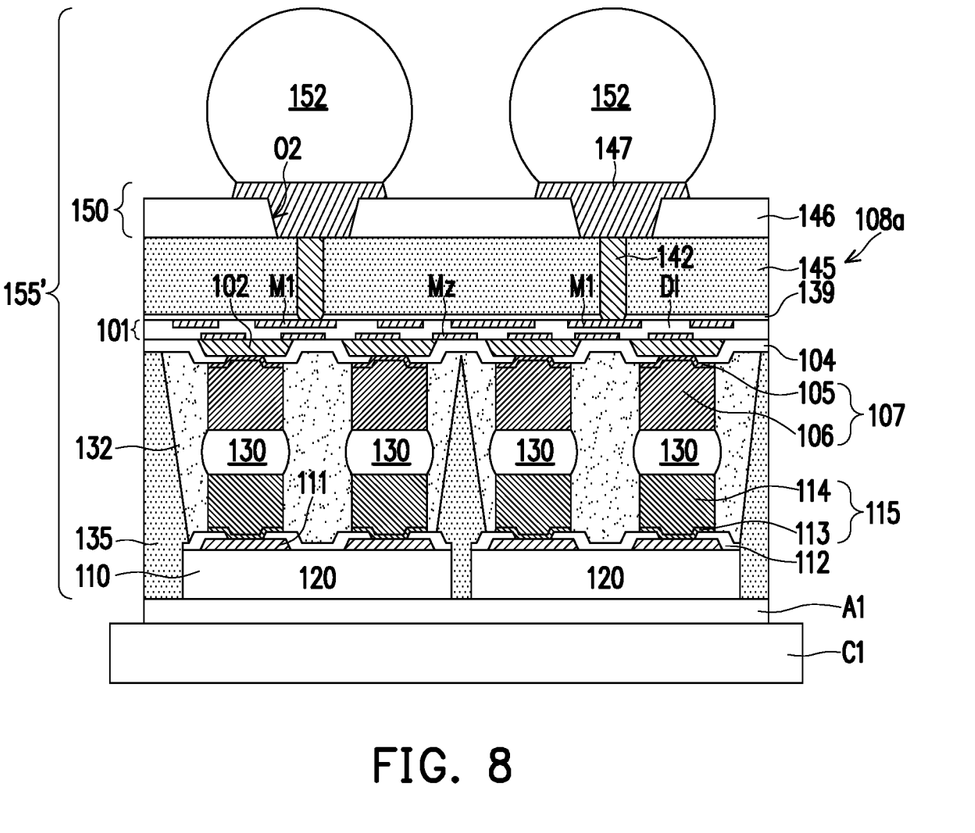

Referring to FIG. 8, a plurality of connectors 152 are then formed on and electrically connected to the RDL structure 150. The connectors 152 may be solder balls, controlled collapse chip connection (C4) bumps, or the like. In some embodiments, the material of the connector 52 includes copper, aluminum, lead-free alloys (e.g., gold, tin, silver, aluminum, or copper alloys) or lead alloys (e.g., lead-tin alloys). The connectors 152 may be formed by ball mounting process or a C4 process. The connectors 152 are electrically connected to the interposer 108a through the RDL structure 150, and further electrically coupled to the dies 120 through the interposer 108a. In some embodiments, the connectors 152 may be formed directly over the through vias 142, that is, the connectors 152 may be overlapped with the through vias 142 in a direction perpendicular to the top surface of the interposer 108a, but the disclosure is not limited thereto. In alternative embodiments, the connectors 152 may be formed to be not directly over the through vias 142, so as to be staggered with the through vias 142 in a direction perpendicular to the top surface of the interposer 108a.

As such, a structure 155' is formed on the carrier C1. The structure 155' may be referred to as package structure.

Figure 9:
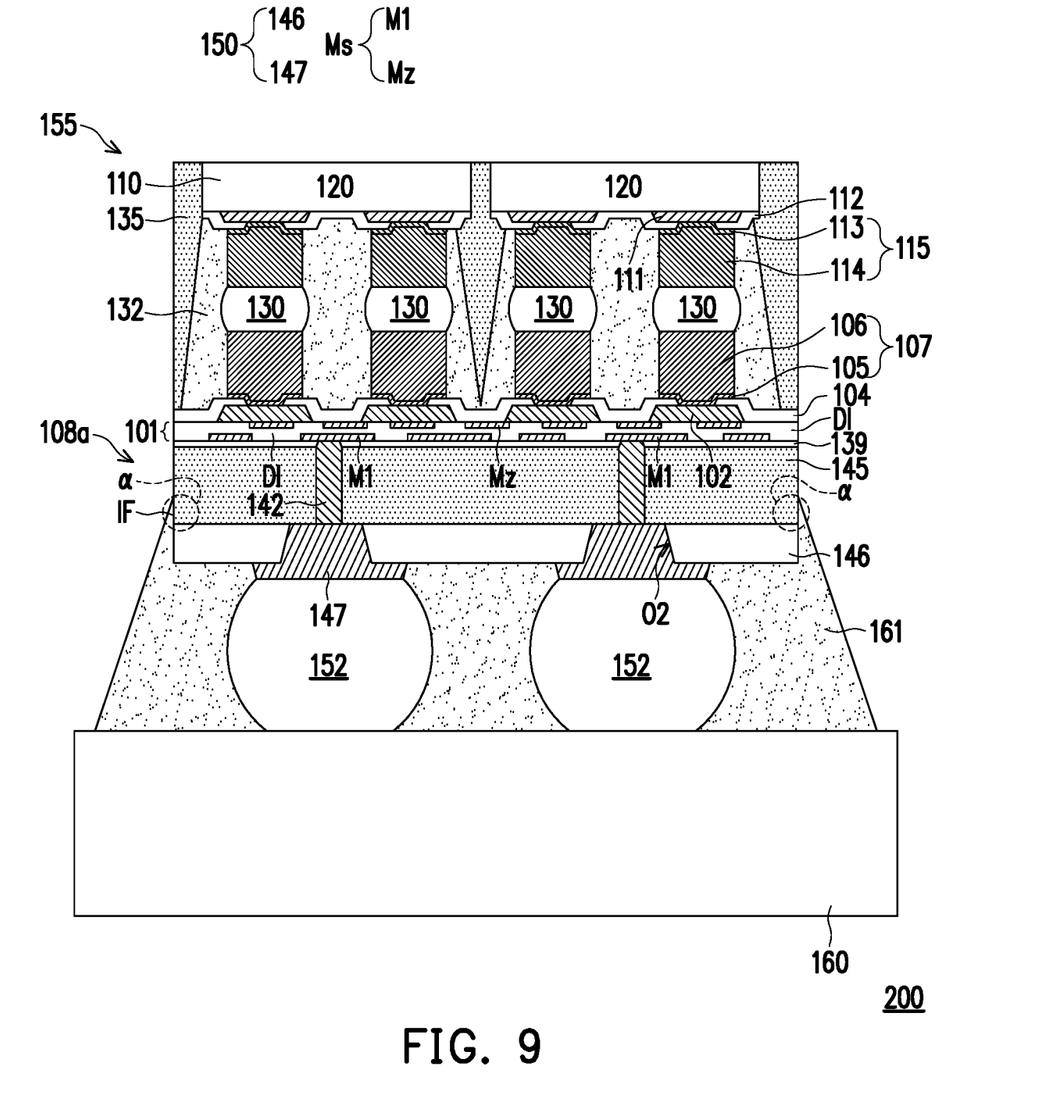
Figure 10:
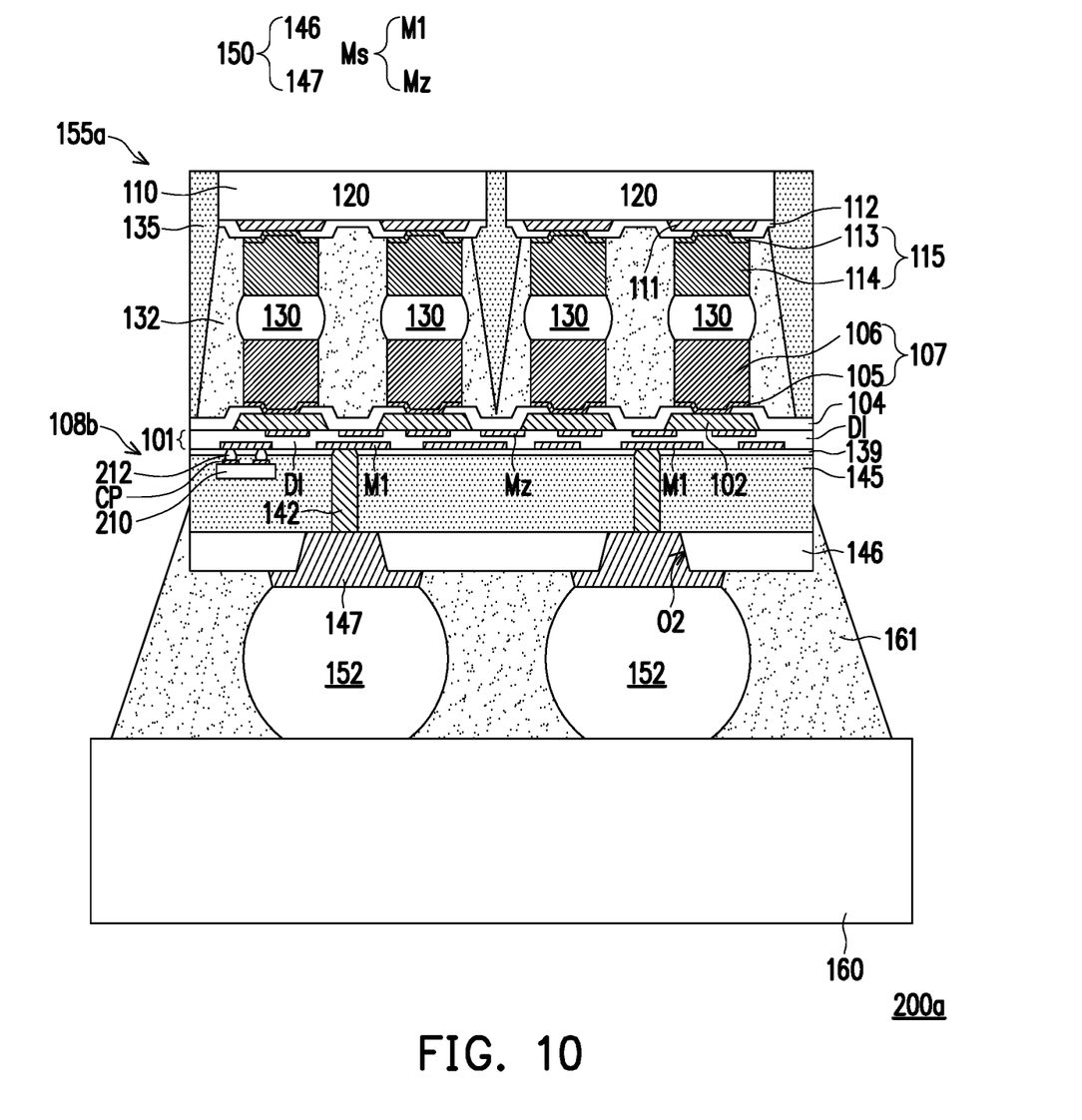
FIG. 10 is a schematic cross-sectional view illustrating a package structure according to some embodiments of the disclosure.

Referring to FIG. 8 and FIG. 9, the carrier C1 is then released from the overlying structure. For example, the de-bonding layer on the carrier C1 is decomposed under the heat of light, and the carrier 10 is then released from the overlying structure. The adhesive layer A1 may be removed by a cleaning process, for example. In some embodiments, thereafter, a singulation process may be performed on the structure 155' to form a plurality of singulated package structures 155.

In some embodiments, the package structure 155 includes the dies 120, the interposer 108a, the underfill layers 132, the encapsulant 135, the RDL structure 150 and the connectors 152. The interposer 108a may be an encapsulant interposer 108a and include the encapsulant 145 serving as a substrate. The interconnection structure 101 of the interposer 108a and the RDL structure 150 are disposed on opposite vertical sides of the encapsulant substrate 145. For example, the interconnection structure 101 is disposed on front side of the encapsulant substrate 145, and the RDL structure 150 is disposed on back side of the encapsulant substrate 145, which may also be referred to as a back-side RDL structure. The sidewalls of the encapsulant 145 may be substantially coplanar with the sidewalls of the interconnection structure 101 and the sidewalls of the RDL structure 146. The dies 120 and the connectors 152 are disposed on opposite vertical sides of the interposer 108a. The connectors 152 may also be referred to as conductive terminals of the package structure 155. In some embodiments, the package structure 155 may also be referred to as a CoW package structure.

Afterwards, the package structure 155 may be electrically coupled to a package substrate 160 through the connectors 152. The package structure 160 may be a circuit substrate, such as a printed circuit board (PCB).

In some embodiments, an underfill layer 161 is formed to fill the space between the package structure 155 and the package structure 160 by, for example, a dispensing process. The underfill layer 161 laterally surrounds the connectors 152, and covers the bottom surface of the RDL structure 150. In some embodiments, the underfill layer 161 may further cover the sidewalls of the dielectric layer 146 of the RDL structure 150 and the sidewalls of the encapsulant 145 of the interposer 108a. The underfill layer 161 may include a material similar to and may be the same as or different from the material of the underfill layer 132.

In some embodiments, a package structure 200 is thus formed, the package structure 200 includes the package structure 155, the package substrate 160 and the underfill layer 161. The package structure 200 may also be referred to as a chip-on-wafer-on-substrate (CoWoS) package.

Still referring to FIG. 9, in some embodiments, both of the substrate (i.e. encapsulant 145) of the interposer 108 and the underfill layer 161 include organic dielectric material. In some embodiments, the corners (or edges) a of the encapsulant substrate 145 are covered by and in physical contact with the underfill layer 161 and/or the dielectric layer (polymer layer) 146. The interface IF between the encapsulant substrate 145 and the underfill layer 161 may be dielectric-to-dielectric interface, which may include an organic dielectric-to-organic dielectric interface, an inorganic dielectric-to-inorganic dielectric interface, an inorganic dielectric-to-organic dielectric interface, or combinations thereof. The interface between the encapsulant substrate 145 and the dielectric layer 146 may also be dielectric-to-dielectric interface, which may include an organic dielectric-to-organic dielectric interface, an inorganic dielectric-to-inorganic dielectric interface, an inorganic dielectric-to-organic dielectric interface, or combinations thereof. In some embodiments, the interface between the corner a of the encapsulant substrate 145 and the underfill layer 161 and/or the interface between the corner a of the encapsulant substrate 145 and the dielectric layer 146 are free of semiconductor-to-dielectric interface.

In some embodiments, the coefficient of thermal expansion (CTE) of the substrate (i.e. the encapsulant 145) of the interposer 108a, the CTE of the underfill layer 161 and the CTE of the dielectric layer 146 may be close to each other. In some embodiments, the CTE of the encapsulant substrate 145 may be less than or equal to the CTE of the underfill layer 161. For example, the CTE of the encapsulant substrate 145 of the interposer 108a may be in a range of 5 ppm/° C. to 20 ppm/° C. The CTE of the underfill layer 161 may be in a range of 20 ppm/° C. to 40 ppm/° C. The ratio of the CTE of the underfill layer 161 to the CTE of the encapsulant substrate 145 may range from 1 to 10.

In some embodiments, the CTE of the encapsulant 145 is similar to (substantially the same as) the CTE of the encapsulant 135, and the CTE of the underfill layer 161 is similar to (substantially the same as) the CTE of the underfill layer 132. The ratio of the CTE of the encapsulant 145 to the CTE of the underfill layer 161 may be in a substantially same range as the ratio of the CTE of the encapsulant 135 to the CTE of the underfill layer 132.

In some embodiments, the CTE of the encapsulant substrate 145 is larger than the CTE of the semiconductor substrate 110 of the die 120. For example, the CTE of the semiconductor substrate 110 may range from 2 ppm/° C. to 3 ppm/° C. In some embodiments, the difference between the CTE of the encapsulant substrate 145 and the CTE of the underfill layer 161 is much smaller than the difference between the CTE of the semiconductor substrate 110 and the CTE of the underfill layer 132. The Young's modulus of the encapsulant substrate 145 of the interposer 108a may be less than the Young's modulus of the substrate 110 of the die 120.

In the embodiments of the disclosure, the substrate of the interposer is an encapsulant substrate, and the encapsulant substrate has a CTE close to the CTE of the underfill layer between the interposer and the package structure or the CTE of the dielectric layer of RDL structure, that is, the CTE mismatch between the substrate of the interposer and the underfill layer and the CTE mismatch between the substrate of the interposer and the dielectric layer of the RDL structure are significantly reduced or eliminated, and issues may be caused by such CTE mismatch are avoided or reduced, thereby improving the reliability of the package structure.

For example, through using the encapsulant as the substrate of the interposer, issues such as underfill crack at interposer corner, interposer substrate crack, delamination between the interposer substrate and back side polymer layer are avoided or significantly reduced. On the other hand, the TMVs and the surrounding encapsulant substrate are configured to have sufficient thickness (i.e. height) and back side RDL/polymer layer are formed on the encapsulant substrate, so as to release and reduce the stress from the package substrate applied to the conductive features of the interconnection structure, and the deformation issue of the conductive features is avoided.

In the foregoing embodiment, the interposer 108a may be free of active devices or passive devices. However, the disclosure is not limited thereto. FIG. 10 illustrates a package structure 200a according to some other embodiments. The package structure 200a is similar to the package structure 200, except that a device is included in the interposer 108b. Like elements are designated with the same reference numbers for ease of understanding and the details thereof are not repeated herein.

Referring to FIG. 10, in some embodiments, the package structure (CoWoS package) 200a includes a package structure (CoW package) 155a on package substrate 160. In some embodiments, the interposer 108b of the package structure 155a include a device 210. The device 210 may be an integrated passive device (IPD). The IPD may be a capacitor, a resistor, an inductor or the like, or combinations thereof. The number of the device 210 is not limited to that is shown in FIG. 10, but may be adjusted according to product design. In some embodiments, the interposer 108b includes passive device and is free of active devices.

In some embodiments, the device 210 is embedded in the encapsulant substrate 145 and laterally aside the conductive posts 142. The device 210 is electrically connected to the conductive feature M1 of the interconnection structure 101 through a plurality of connectors 212. The connectors 212 may be micro bumps such as solder bumps or other suitable metallic bumps. In some embodiments, the device 210 includes a plurality of conductive pads CP, and the connectors 212 are disposed between the conductive pads CP of the device 210 and the conductive feature M1 to provide the electrical connection therebetween. The connectors 212 penetrates through the dielectric layer 139 and may be laterally surrounded by the dielectric layer 139 and the encapsulant substrate 145.

In some embodiments, the mounting of the device 210 may be performed after forming the conductive posts 142 and before forming the encapsulant 145. For example, after the conductive posts 142 are formed on the interconnection structure 101 as shown in FIG. 5A, a patterning process such as laser drilling process or photolithograph and etching process may be performed to remove a portion of the dielectric layer 139, so as to form openings in the dielectric layer 139 to expose a portion of the top surface of the conductive feature M1. Thereafter, the device 210 is electrically bonded to the conductive feature M1 exposed by the openings of the dielectric layer 139 through the connectors 212. Afterwards, the encapsulant 145 is formed on the interconnection structure 101 to encapsulant the device 210 and the conductive posts 142. In some embodiments, after mounting the device 210 and before forming the encapsulant 145, an underfill layer (not shown) may be optionally formed to fill the space between the device 210 and the dielectric layer 139 to laterally surround the connectors 212 and the conductive pads CP.

In some embodiments, such configuration of encapsulant substrate and the device embedded therein may improve the yield of the device. The other features of the package structure 200a are substantially the same as those of the package structure 200, which are not repeated herein.

In accordance with some embodiments of the disclosure, a package structure includes an interposer, a die and a conductive terminal. The interposer includes an encapsulant substrate, a through via and an interconnection structure. The through via is embedded in the encapsulant substrate. The interconnection structure is disposed on a first side of the encapsulant substrate and electrically connected to the through via. The die is electrically bonded to the interposer and disposed over the interconnection structure and the first side of the encapsulant substrate. The conductive terminal is disposed on a second side of the encapsulant substrate vertically opposite to the first side, and electrically connected to the interposer and the die.

In accordance with alternative embodiments of the disclosure, a package structure includes a circuit substrate, an interposer, a first underfill layer, a die and a second underfill layer. The interposer is disposed on and electrically connected to the circuit substrate, wherein the interposer comprises a first substrate and a through via embedded in the first substrate, and there is free of dielectric liner laterally between the through via and the first substrate. The first underfill layer is disposed to fill a space between the interposer and the circuit substrate. The die is disposed on and electrically connected to the interposer, wherein the die comprises a second substrate. The second underfill layer is disposed to fill a space between the die and the interposer.

In accordance with some embodiments of the disclosure, a method of manufacturing a package structure includes the following processes. A die is bonded to a wafer, wherein the wafer includes a semiconductor substrate and an interconnection structure on the semiconductor substrate. The semiconductor substrate is removed to expose a conductive feature of the interconnection structure. A conductive post is formed on the conductive feature. An encapsulant is formed to laterally encapsulate the conductive post, and an interposer including the encapsulant, the conductive post and the interconnection structure is formed, the interposer is electrically connected to the die. A conductive terminal is formed to electrically connect to the conductive post of the interposer.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:
1. A package structure, comprising:
an interposer, comprising:
  an encapsulant substrate;
  a through via embedded in the encapsulant substrate; and
  an interconnection structure on a first side of the encapsulant substrate and electrically connected to the through via;
a die electrically bonded to the interposer, wherein the die is disposed over the interconnection structure and the first side of the encapsulant substrate; and
a conductive terminal disposed on a second side of the encapsulant substrate vertically opposite to the first side, and electrically connected to the interposer and the die.

2. The package structure of claim 1, wherein the encapsulant substrate comprises a molding compound.

3. The package structure of claim 1, wherein sidewalls of the through via are laterally encapsulated by and in contact with the encapsulant substrate.

4. The package structure of claim 1, further comprising a redistribution layer (RDL) structure, disposed between the interposer and the conductive terminal to provide electrical connection.

5. The package structure of claim 1, further comprising an encapsulant on the interposer and laterally encapsulating the die, wherein the encapsulant comprises a same material as the encapsulant substrate.

6. The package structure of claim 1, wherein the interposer further comprises a passive device embedded in the encapsulant substrate and electrically connected to the interconnection structure.

7. The package structure of claim 1, further comprising:
a package substrate, electrically connected to the interposer through the conductive terminal; and
an underfill layer, configured to fill a space between the interposer and the package substrate.

8. A package structure, comprising:
a circuit substrate;

an interposer disposed on and electrically connected to the circuit substrate, wherein the interposer comprises a first substrate and a through via embedded in the first substrate, and the through via is in physical contact with the first substrate;

a first underfill layer, disposed to fill a space between the interposer and the circuit substrate;

a die disposed on and electrically connected to the interposer, wherein the die comprises a second substrate; and a second underfill layer, disposed to fill a space between the die and the interposer.

9. The package structure of claim 8, wherein the first substrate is free of semiconductor material, and the second substrate is a semiconductor substrate.

10. The package structure of claim 8, wherein the first substrate comprises a molding compound.

11. The package structure of claim 8, wherein a difference between a coefficient of thermal expansion (CTE) of the first substrate of the interposer and a CTE of the first underfill layer is smaller than a difference between a CTE of the second substrate of the die and a CTE of the second underfill layer.

12. The package structure of claim 8, wherein a CTE of the first substrate of the interposer is larger than or equal to a CTE of the first underfill layer.

13. The package structure of claim 8, wherein the first underfill layer is in contact with an edge of the first substrate, and an interface between the first underfill layer and the first substrate comprises a dielectric-to-dielectric interface.

14. The package structure of claim 8, further comprising an encapsulant on the interposer and laterally encapsulating the second underfill layer and the die.

15. The package structure of claim 14, wherein the encapsulant and the first substrate of the interposer comprise a same material.

16. A method of manufacturing a package structure, comprising:

bonding a die to a wafer, wherein the wafer comprises a semiconductor substrate and an interconnection structure on the semiconductor substrate;

removing the semiconductor substrate to expose a conductive feature of the interconnection structure;

forming a conductive post on the conductive feature;

forming an encapsulant to laterally encapsulate the conductive post, and an interposer comprising the encapsulant, the conductive post and the interconnection structure is formed, the interposer is electrically connected to the die; and forming a conductive terminal to electrically connect to the conductive post of the interposer.

17. The method of claim 16, wherein the semiconductor substrate is completely removed, and the encapsulant serves as a substrate of the interposer.

18. The method of claim 16, further comprising mounting a passive device on the interconnection structure after forming the conductive post, and the encapsulant is formed to further encapsulate the passive device.

19. The method of claim 16, wherein before forming the conductive terminal, further comprising forming a RDL structure on the encapsulant and the conductive post of the interposer, the RDL structure comprises a redistribution layer electrically connected to the conductive post of the interposer, and the conductive terminal is formed on and electrically connected to the redistribution layer of the RDL structure.

20. The method of claim 16, further comprising:

mounting the package structure to a circuit substrate through the conductive terminal; and forming an underfill layer to fill a space between the interposer and the circuit substrate, wherein the under fill layer is in contact with the encapsulant at a corner of the interposer.

* * * * *